United States Patent
Kim

(10) Patent No.: US 10,070,559 B2
(45) Date of Patent: Sep. 4, 2018

(54) ENERGY STORAGE SYSTEM CASE AND ENERGY STORAGE SYSTEM INCLUDING THE SAME

(71) Applicant: SAMSUNG SDI CO., LTD., Yongin-si, Gyeonggi-do (KR)

(72) Inventor: Myoung Kon Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 15/398,347

(22) Filed: Jan. 4, 2017

(65) Prior Publication Data

US 2017/0202105 A1 Jul. 13, 2017

(30) Foreign Application Priority Data

Jan. 13, 2016 (KR) .................. 10-2016-0004302

(51) Int. Cl.
*H05K 7/20* (2006.01)
*H01M 10/613* (2014.01)
(Continued)

(52) U.S. Cl.
CPC ........ *H05K 7/2039* (2013.01); *H01M 2/1077* (2013.01); *H01M 10/425* (2013.01); *H01M 10/613* (2015.04); *H01M 10/627* (2015.04); *H01M 10/6551* (2015.04); *H02J 7/0029* (2013.01); *H02J 7/0042* (2013.01); *H05K 5/0086* (2013.01); *H05K 5/03* (2013.01); *H01M 2010/4271* (2013.01); *H01M 2220/10* (2013.01)

(58) Field of Classification Search
None
See application file for complete search history.

(56) References Cited

U.S. PATENT DOCUMENTS 9,142,812 B2 * 9/2015 Hwang ............... H01M 2/0215
9,484,592 B2   11/2016 Roh et al.
(Continued)

FOREIGN PATENT DOCUMENTS

JP      11-102611      4/1999
JP     2001-6639 A    1/2001
(Continued)

OTHER PUBLICATIONS

KIPO Office Action dated Jun. 16, 2017, for corresponding Korean Patent Application No. 10-2016-0004302 (7 pages).
(Continued)

*Primary Examiner* — Courtney Smith
(74) *Attorney, Agent, or Firm* — Lewis Roca Rothgerber Christie LLP

(57) ABSTRACT

Provided are an energy storage system case and an energy storage system including the same. An energy storage system case includes: a body unit including a battery accommodating unit configured to accommodate a plurality of batteries, and a control module mounting unit on both sides of which control modules are configured to be mounted to control charge/discharge of a plurality of batteries; a casing cover coupled to the body unit; and a heat-dissipation unit located opposite the casing cover and coupled to the control module mounting unit to dissipate heat generated by a first control module among the control modules to an outside thereof.

18 Claims, 6 Drawing Sheets

(51) Int. Cl.
*H01M 10/627* (2014.01)
*H01M 10/6551* (2014.01)
*H01M 2/10* (2006.01)
*H01M 10/42* (2006.01)
*H02J 7/00* (2006.01)
*H05K 5/00* (2006.01)
*H05K 5/03* (2006.01)

(56) References Cited

U.S. PATENT DOCUMENTS

| | | | |
|---|---|---|---|
| 2009/0253027 A1 | 10/2009 | Yang et al. | |
| 2012/0164414 A1 | 6/2012 | Nakayama et al. | |
| 2012/0308848 A1 | 12/2012 | Miyamae et al. | |
| 2015/0044518 A1* | 2/2015 | Scheucher | B60K 1/04 429/49 |
| 2015/0118530 A1* | 4/2015 | Lee | H01M 10/486 429/82 |
| 2015/0123481 A1* | 5/2015 | Reihlen | B60L 11/1874 307/80 |
| 2015/0194707 A1* | 7/2015 | Park | H01M 10/4207 429/50 |
| 2016/0013520 A1* | 1/2016 | Fetzer | B60L 11/1853 429/7 |
| 2016/0099489 A1* | 4/2016 | Park | H01M 10/613 429/120 |
| 2016/0226034 A1* | 8/2016 | Seok | H01M 2/1016 |

FOREIGN PATENT DOCUMENTS

| | | |
|---|---|---|
| JP | 2010-146774 A | 7/2010 |
| JP | 2011-154986 A | 8/2011 |
| JP | 2014-13724 A | 1/2014 |
| JP | 2014-167907 A | 9/2014 |
| KR | 10-2007-0110567 | 11/2007 |
| KR | 10-2010-0064342 A | 6/2010 |
| KR | 10-2013-0137299 A | 12/2013 |

OTHER PUBLICATIONS

KIPO Registration Determination dated Dec. 28, 2017, for corresponding Korean Patent Application No. 10-2016-0004302 (2 pages).

* cited by examiner

ENERGY STORAGE SYSTEM CASE AND ENERGY STORAGE SYSTEM INCLUDING THE SAME

CROSS-REFERENCE TO RELATED APPLICATION

This application claims priority to and the benefit of Korean Patent Application No. 10-2016-0004302, filed on Jan. 13, 2016 in the Korean intellectual Property Office, the entire disclosure of which is incorporated herein by reference.

BACKGROUND

1. Field

Aspects of embodiments relate to an energy storage system case and an energy storage system including the same.

2. Description of the Related Art

An energy storage system is associated with a renewable energy system or a power system to store power when the load power demand is small and allow use of the stored power when the load power demand is large.

Since the energy storage system includes a plurality of secondary batteries and control modules controlling the plurality of secondary batteries, it needs to have a waterproof and vibration-proof structure for protecting the plurality of secondary batteries and control modules from an external environment, such as impacts or moisture permeation.

For this purpose, various methods, such as silicon processing, O-ring (rubber or silicon) processing, and foaming (liquid) processing are applied in an assembly process of the energy storage system; however, if is not easy to realize an adhesion structure between assembly parts according to part assembly surface flatness or conditions thereof. This is because a part assembly surface should be flat, but it is not possible to planarize in an actual process. Also, in the case of a liquid, a curing process is time-consuming and is not easy.

Also, it is not easy to effectively dissipate the heat generated by the control modules to the outside thereof.

SUMMARY

According to an aspect of one or more embodiments, an energy storage system case has a waterproof and vibration-proof structure for protecting a plurality of secondary batteries and control modules controlling the plurality of secondary batteries accommodated therein, and an energy storage system including the same.

Additional aspects will be set forth in part in the description which follows and, in part, will be apparent from the description, or may be learned by practice of the presented embodiments.

According to one or more embodiments, an energy storage system case includes: a body unit including a battery accommodating unit configured to accommodate a plurality of batteries, and a control module mounting unit on both sides of which control modules are configured to be mounted to control charge/discharge of a plurality of batteries; a casing cover coupled to the body unit; and a heat-dissipation unit located opposite the casing cover and coupled to the control module mounting unit to dissipate heat generated by a first control module among the control modules to an outside thereof.

The control module mounting unit may include a mounting plate having an opening formed therein, and a first side and a second side of the mounting plate may be in communication with each other through the opening.

A first control module may be configured to be mounted on the first side of the mounting plate to contact the heat-dissipation unit mounted on the second side of the mounting plate through the opening.

The heat-dissipation unit may be coupled to the second side of the mounting plate to block the opening.

The casing cover may be coupled to the body unit to face the first side of the mounting plate, and a first control module may be configured to be arranged between the casing cover and the first side of the mounting plate and closed from an outside thereof by the casing cover and the heat-dissipation unit.

The heat-dissipation unit may include a base unit and a heat-dissipation fin extending from the base unit, and the base unit and the second side of the mounting plate may be adhered to each other by an adhesion unit arranged therebetween.

The adhesion unit may include a first adhesion layer, a second adhesion layer, and a foam layer located between the first adhesion layer and the second adhesion layer.

The adhesion unit may be arranged around the opening.

A second control module among the control modules may be configured to be mounted on the second side of the mounting plate spaced apart from the heat-dissipation unit, and the first control module may have a larger heat generation amount than the second control module in an operation for controlling the charge/discharge of the plurality of batteries.

The energy storage system case may further include a control module cover coupled to the second side of the mounting plate and configured to cover the second control module, wherein the control module cover and the second side of the mounting plate may be adhered to each other by an adhesion unit arranged therebetween.

The energy storage system case may further include a heat-dissipation cover coupled to the body unit to face the second side of the mounting plate, wherein each of the heat-dissipation cover and the casing cover may form a flat surface with the body unit.

According to one or more embodiments, an energy storage system includes any of the above-described energy storage system cases, and may further include a plurality of batteries accommodated in the battery accommodating unit, and control modules mounted on both sides of the control module mounting unit and configured to control charge/discharge of the plurality of batteries.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
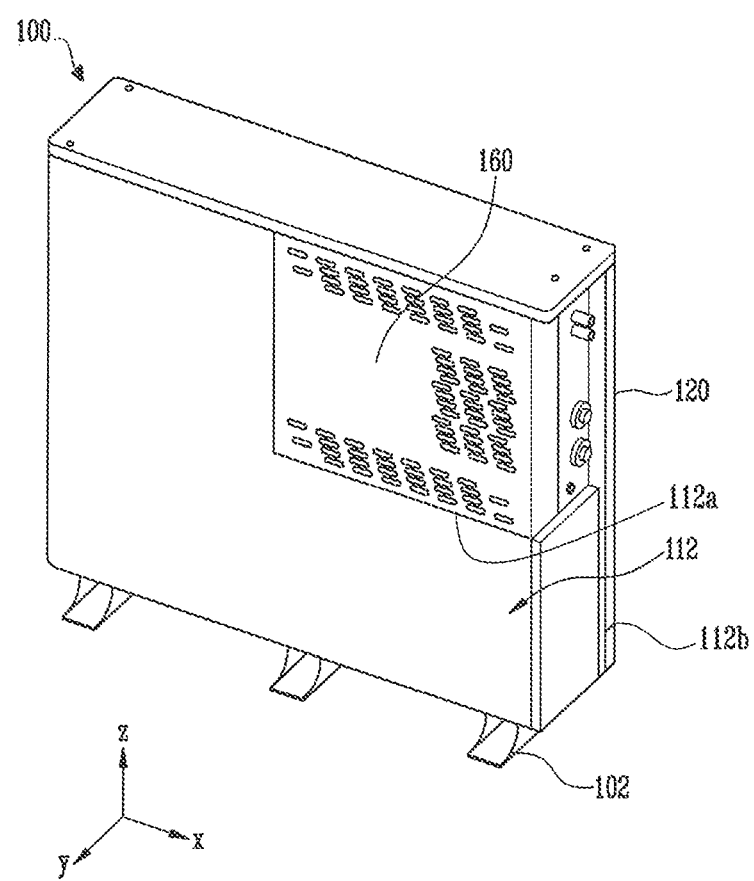
FIG. 1 is a perspective view of an energy storage system case according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The inventive concept may include various embodiments and modifications, and certain embodiments thereof are illustrated in the drawings and will be described herein in further detail. However, it will be understood that the inventive concept is not limited to the particular embodiments and includes all modifications, equivalents, and substitutions falling within the spirit and scope of the inventive concept. In the specification and drawings, like reference numerals may be used to denote like elements.

Hereinafter, some embodiments of the inventive concept will be described in further detail with reference to the accompanying drawings.

Figure 2:
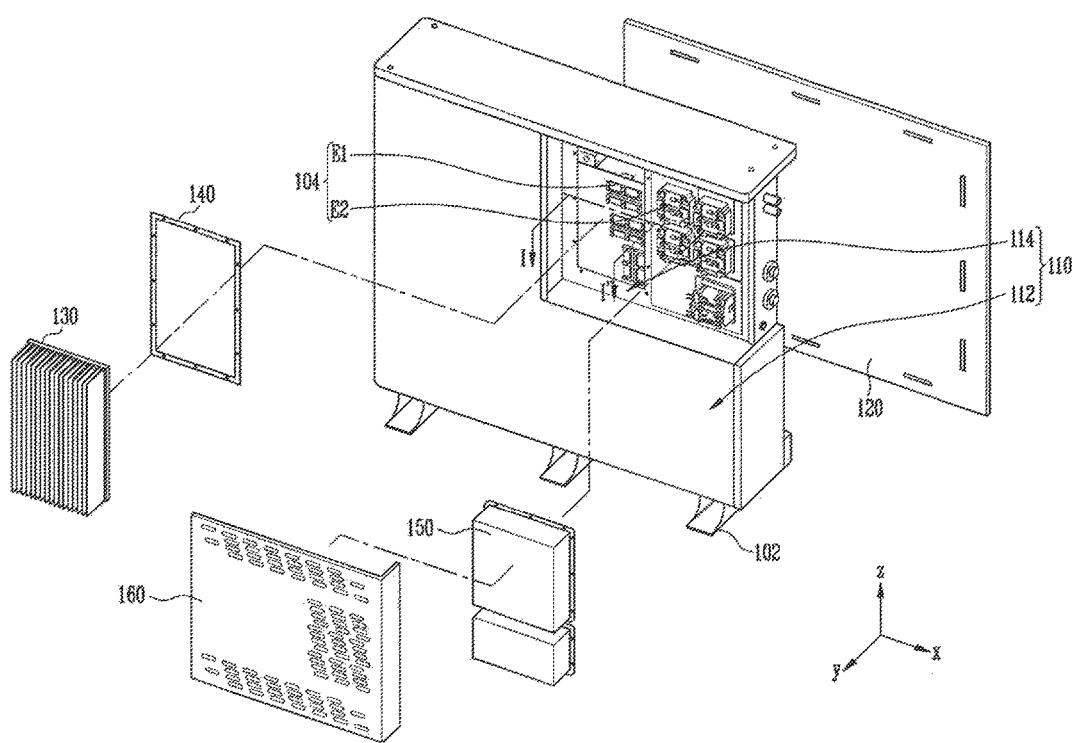
FIG. 2 is an exploded perspective view of the energy storage system case of FIG. 1.
Figure 3A:
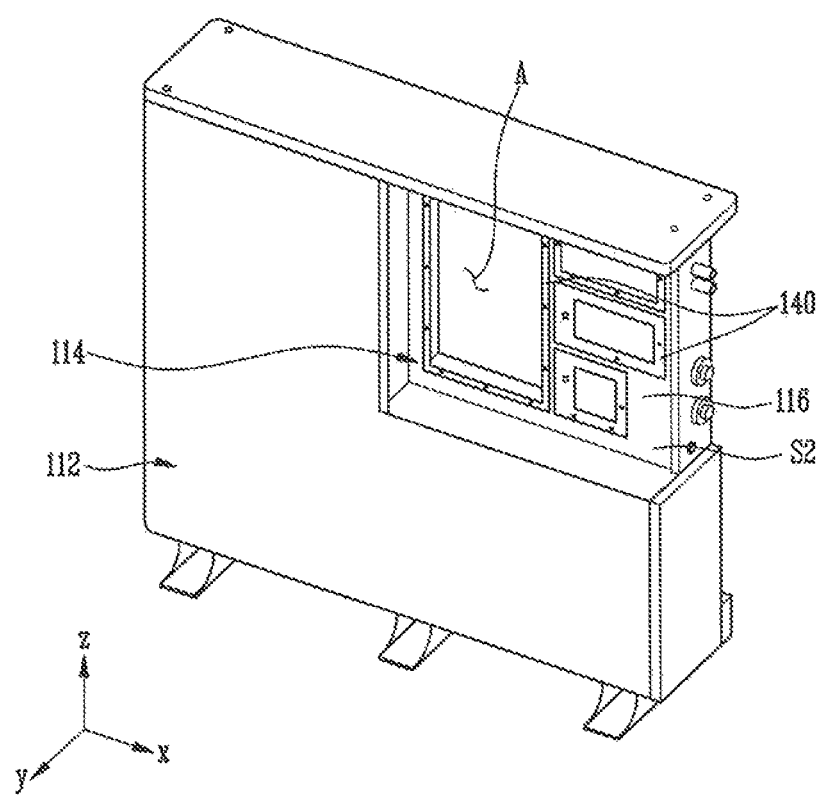
FIG. 3A is a front perspective view of the energy storage system case of FIG. 1, shown in a state in which control modules are removed therefrom in order to illustrate a control module mounting unit of the energy storage system case.
Figure 3B:
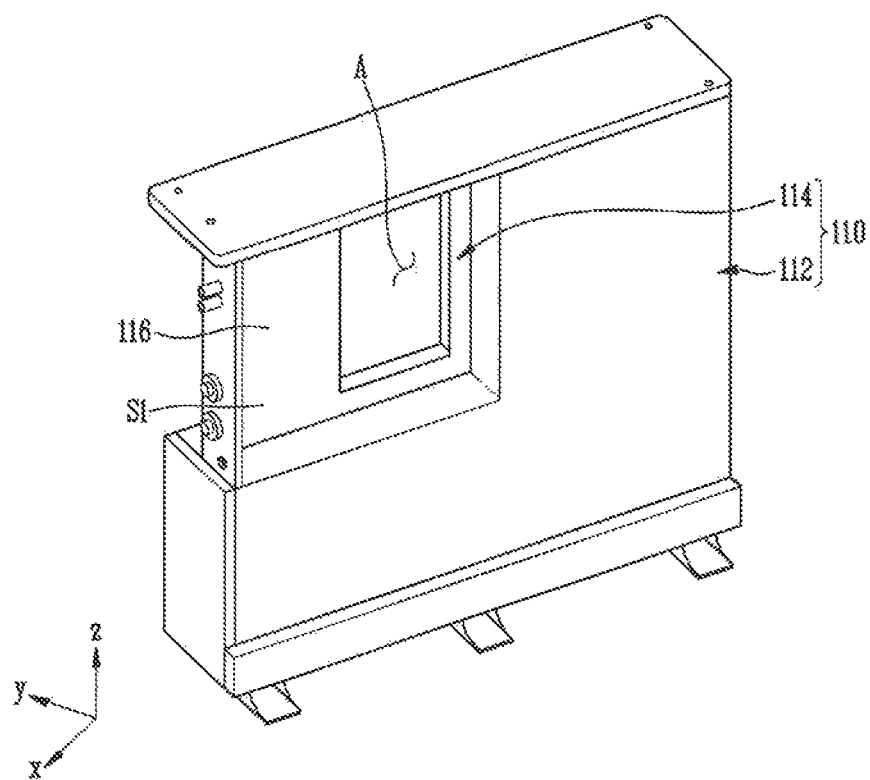
FIG. 3B is a rear perspective view corresponding to FIG. 3A.

FIG. 1 is a perspective view of an energy storage system case 100 according to an embodiment. FIG. 2 is an exploded perspective view of the energy storage system case 100 according to an embodiment. FIGS. 3A to 3B are a front perspective view and a rear perspective view, respectively, of the energy storage system case 100, shown in a state in which control modules 104 are removed therefrom in order to illustrate a control module mounting unit 114 of the energy storage system case 100.

As illustrated in FIGS. 1 to 3B, the energy storage system case 100 according to an embodiment may include a body unit 110, a casing cover 120, a heat-dissipation unit 130, in adhesion unit 140, a control module coyer 150, and a heat-dissipation cover 160.

First, the body unit 110, or body portion, may include a battery accommodating unit 112, or battery accommodating portion, accommodating a plurality of batteries (not illustrated) and a control module mounting unit 114, or control module mounting portion, on both sides of which the control modules 104 are mounted to control the charge/discharge of the plurality of batteries.

The body unit 110 may form an external appearance of the energy storage system case 100 together with the casing cover 120 and the heat-dissipation cover 160 described below, and, in an embodiment, may be formed in a rectangular parallelepiped shape as a whole.

The battery accommodating unit 112 of the body unit 110 may accommodate a plurality of batteries (not illustrated) therein, and may be formed in a sealing structure to protect the batteries accommodated therein from an external environment (e.g., impact or moisture).

At the body unit 110, terminals for connection with an external device or a power system may be formed to be exposed outside, and the control module mounting unit 114 may be located adjacent to the terminals.

As described below, the control module mounting unit 114 may include a mounting plate 116 having an opening A formed therein, and the control modules 104, that is, a first control module E1 and a second control module E2, may be mounted on both sides of the mounting plate 116.

In an embodiment, the first control module E1 may include a switching element such as an insulated gate bipolar mode transistor (IGST) that involves a larger heat generation amount than other parts. The second control module E2 may include an electronic element, such as an inductor that occupies a larger volume than other parts.

In an embodiment, among the control modules 104, the first control module E1 may be mounted through a printed circuit board (PCS) 106 and a support 1162 supporting the PCB 106 (see FIG. 4), and the second control module E2 may be mounted directly on the mounting plate 116.

A support 102 for separation from and fixation to the ground may be formed under the body unit 110.

According to an embodiment, the control module mounting unit 114 may include the mounting plate 116 having the opening A formed therein, and one side S1 (i.e. a first side) and the other side S2 (i.e. a second side) of the mounting plate 116 may communicate with each other through the opening A.

Among the control modules 104, the first control module E1 may be mounted on the one side S1 of the mounting plate 116, and the second control module E2 may be mounted on the other side S2 of the mounting plate 116.

In an embodiment, the first control module E1 mounted on the one side S1 of the mounting plate 116 may contact the heat-dissipation unit 130 located on the opposite side, that is, the heat-dissipation unit 130 mounted on the other side S2 of the mounting plate 116 through the opening A. The heat-dissipation unit 130, or heat-dissipation member, may be coupled to the other side S2 of the mounting plate 116 to block the opening A. This will be described below in more detail.

The casing cover 120 may be coupled to one side of the body unit 110 to face the one side S1 of the mounting plate 116, and the heat-dissipation cover 160 may be coupled to the other side of the body unit 110 to face the other side S2 of the mounting plate 116.

Since the casing cover 120 is coupled to the body unit 110, a coupling structure of the casing cover 120 and the body unit 110 may be formed in a sealing structure to protect the first module E1 accommodated therein from an external environment such as impact or moisture permeation. That is, as illustrated in FIGS. 2 and 3B, the casing cover 120 may be firmly coupled to the body unit 110 by having a structure completely covering a rear side of the body unit 110.

Accordingly, the first control module E1 present between the casing cover 120 and the one side S1 of the mounting plate 116 may be closed from an external environment.

Since the first control module E1 mounted on the one side S1 of the mounting plate 116 may contact the heat-dissipation unit 130 mounted on the other side S2 of the mounting plate 116 through the opening A, the opening A may also have a sealing structure. In an embodiment, the heat-dissipation unit 130 may, in part, provide the sealing structure.

That is, the heat-dissipation unit 130 may be coupled to the other side S2 of the mounting plate 116 to block the opening A of the mounting plate 116, thus closing the first control module E1 together with the casing cover 120 from an external environment. A mounting structure of the heat-dissipation unit 130 according to an embodiment will be described in more detail with reference to FIG. 4.

Figure 4:
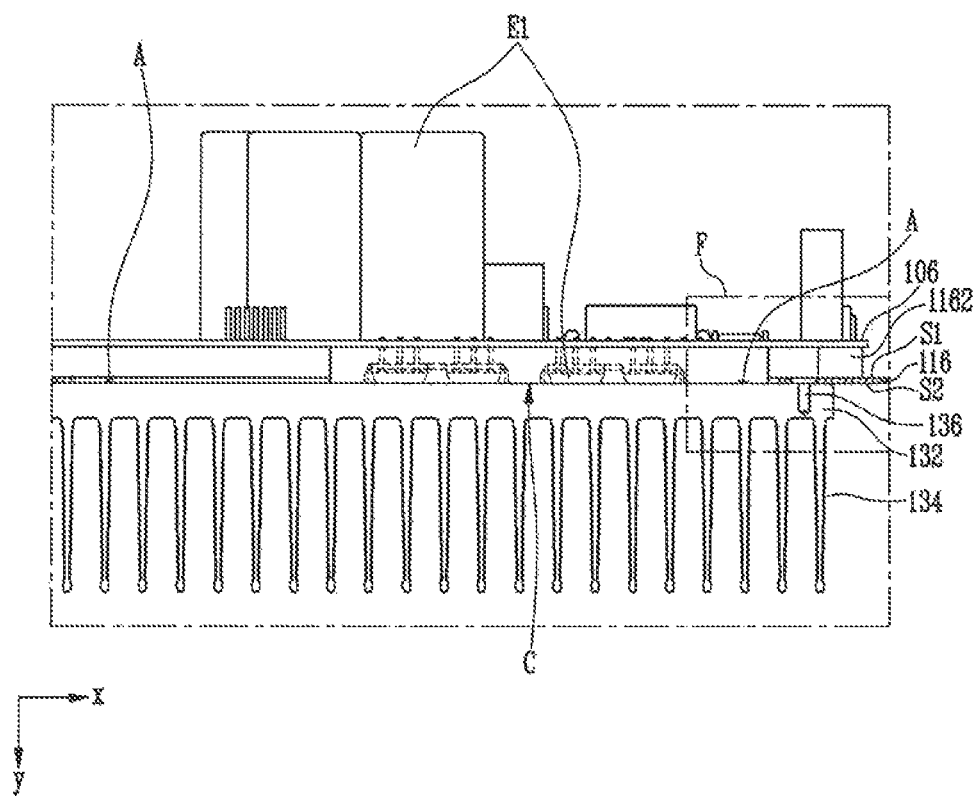
FIG. 4 is a cross-sectional view taken along a line I-I' in FIG. 2, illustrating a mounting structure of a first control module and a heat-dissipation unit, according to an embodiment.

FIG. 4 is a cross-sectional view taken along a line I-I' in FIG. 2, illustrating a mounting structure of the first control module E1 and the heat-dissipation unit 130, according to an embodiment.

As illustrated in FIG. 4, the first control module E1 may be coupled to the one side S1 of the mounting plate 116, and the heat-dissipation unit 130 may be coupled to the other side S2 of the mounting plate 116 to block the opening A. That is, the heat-dissipation unit 130 and the first control module E1 may be located on the opposite sides with respect to the mounting plate 116.

The heat-dissipation unit 130 may include a base unit 132, or a base portion, extending in a direction (e.g., an x-axis direction) to be coupled to the other side S2 of the mounting plate 116 and a heat-dissipation fin 134 extending in a direction (e.g., a y-axis direction) from the base unit 132, and may dissipate the heat generated by the first control module E1 adjacent thereto to the outside thereof.

In an embodiment, the base unit 132 coupled to the other side S2 of the mounting plate 116 may directly contact the first control module E1 located on the one side of the mounting plate 116 through the opening A, and, accordingly, a large amount of heat of an electronic element such as a switching element included in the first control module E1 may be efficiently dissipated outside.

In order for the base unit 132 and the first control module E1 to directly contact each other through the opening A, that is, in order for the base unit 132 and the first control module E1 to directly contact each other to define a contact portion C, some electronic elements of the first control module E1 mounted on the one side S1 of the mounting plate 116 may have a structure extending into the opening A, as illustrated in FIG. 4. As an example, the first control module E1 may haw a double-sided PCB structure in which electronic elements are mounted on both sides of the PCB 106. Referring to FIG. 4, in an embodiment, electronic elements are located on both a top side and a bottom side of the PCB 106 of the first control module E1, and the electronic elements located on the bottom side extend into the opening A. However, the inventive concept is not limited thereto, and the base unit may have a structure extending into the opening in order for the base unit and the first control module to directly contact each other through the opening.

As described above, the first control module E1 may be mounted on one side of the mounting plate 116 through the coupling relationship between the PCB 106 of the first control module E1 and the support 1162 of the mounting plate 116 that supports the PCB 106.

In this manner, since the opening A of the mounting plate 116 may be closed by the heat-dissipation unit 130, the first control module E1 mounted on the one side S1 of the mounting plate may be completely blocked from an external environment by the casing cover 120 and the heat-dissipation unit 130. That is, the top side of the first control module E1 may be closed by the casing cover 120 and the bottom side of the first control module E1 may be closed by the heat-dissipation unit 130 to form a complete sealing structure for the first control module E1.

Thus, according to an embodiment, efficient heat-dissipation may be performed by making a direct contact between the heat-dissipation unit 130 and the first control module E1 involving a larger heat generation amount than other parts in operation, and the first control module E1 may be protected from an external environment, such as impact or moisture permeation, by achieving a complete sealing structure by the casing cover 120 and the heat-dissipation unit 130.

The base unit 132 of the heat-dissipation unit may be mounted on the other side S2 of the mounting plate 116 through a fastening unit 136, or fastening member (e.g., a separate fastening unit). As an example, the base unit 132 may be mounted on the other side S2 of the mounting plate 116 by the fastening unit 136 that is fastened into the base unit 132 from the one side S1 to the other side S2 of the mounting plate 116 (e.g., in a +y direction).

According to an embodiment, the adhesion unit 140, or adhesion member, interposed between the base unit 132 and the mounting plate 116 may be further included for a sealing structure for the first control module E1. This will be described below in more detail with reference to FIGS. 5 and 6.

Figure 5:
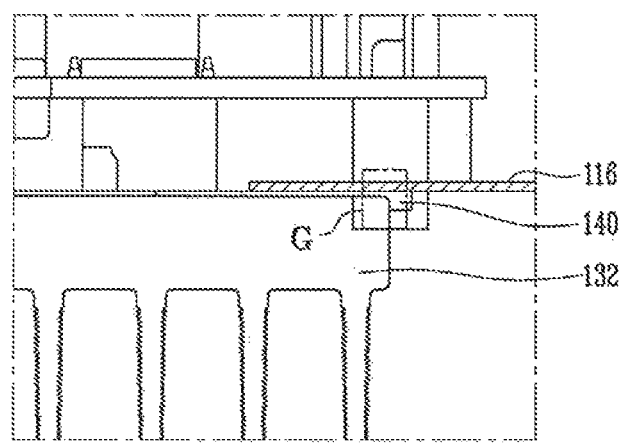
FIG. 5 is an enlarged view of a region "F" in FIG. 4, illustrating a mounting structure between a mounting plate and a base unit, according to an embodiment.
Figure 6:
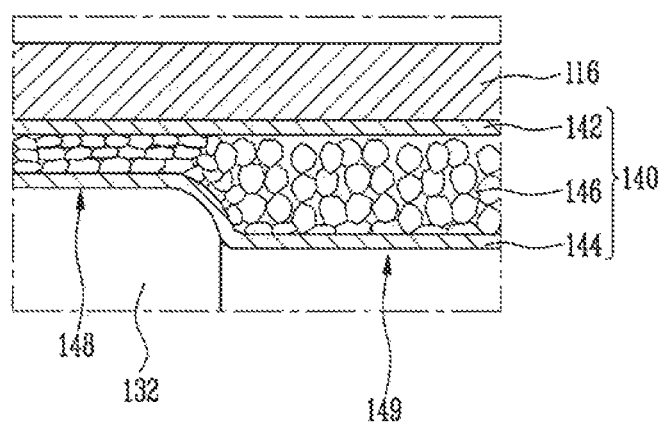
FIG. 6 is an enlarged view of a region "G" in FIG. 5, illustrating a configuration of an adhesion unit according to an embodiment.

FIG. 5 is an enlarged view of a region "F" in FIG. 4, illustrating a mounting structure between the mounting plate 116 and the base unit 132, according to an embodiment. FIG. 6 is an enlarged view of a region "G" in FIG. 5, illustrating a configuration of the adhesion unit 140 according to an embodiment.

As illustrated in FIGS. 5 and 6, the base unit 132 and the mounting plate 116 may be adhered to each other by the adhesion unit 140 interposed therebetween, and, in an embodiment, the adhesion unit 140 may include an adhesion layer 142 on one side thereof, an adhesion layer 144 on the other side thereof, and a foam layer 146 located therebetween.

As an example, the adhesion unit 140 may include a double-sided adhesive tape having a foam layer 146 formed therein, and the foam layer 146 may be formed of silicon or urethane foam.

Since the base unit 132 and the mounting plate 116 may be adhered to each other by the adhesion unit 140 including the foam layer 146, it may have a small adhesion thickness after assembly and may have a high adhesion without being greatly affected by the flatness of a part assembly surface. This is because the foam layer is compressed in an assembly process.

As illustrated in FIGS. 5 and 6, since the base unit 132 is assembled to the mounting plate 116 in a state in which the adhesion unit 140 is placed around the opening A of the mounting plate 116, a portion of the adhesion unit 140 is compressed, that is, a compressed portion 148.

In comparison with an uncompressed portion 149, the thickness of the compressed portion 148 decreases according to the compression of the foam layer 146 therein. This may offset the unevenness of an assembly surface, that is, a low-flatness portion of the assembly surface of the mounting plate 116 or the base unit 132 and may increase the heat transfer efficiency and the waterproof and vibration-proof effect by further tightening the adhesion between the base unit 132 of the heat-dissipation unit 130 and the mounting plate 110 on which heating elements are mounted.

For example, the adhesion unit 140 having a thickness of about 3 mm before assembly, for example, may have a thickness of about 1 mm after assembly due to the intermediate foam layer 146. That is, in the adhesion unit 140, the uncompressed portion 149 may have a thickness of about 3 mm and the compressed portion 148 may have a thickness of about 1 mm.

As the adhesion thickness decreases after the assembly between the mounting plate 116 and the base unit 132 and the adhesion between parts increases without the influence of the flatness of a part assembly surface, since the contact between the base unit 132 and the first control module E1 adjacent thereto may be further tightened, a high heat transfer efficiency may be secured and also a waterproof and vibration-proof effect against the external environment may be improved.

Also, since the adhesion unit 140 is a structure attached in a sheet form, the processability thereof is excellent, and since a sheet may have only to be reattached even in an after-sales service (A/S), the pad replacement thereof is easy.

According to an embodiment, the adhesion unit 140 may be placed around the opening A of the mounting plate 116, and the base unit 132 and the mounting plate 110 may be adhered to each other with the adhesion unit 140 interposed therebetween.

In an embodiment, the fastening unit 136 may be fastened into the base unit 132 through the adhesion unit 140 placed around the opening A, and, in the case of requiring fastening without passing therethrough, the fastening unit 136 may be fastened into the base unit at a different fastening position by reducing the width of the adhesion unit or by avoiding a region where the adhesion unit is present.

Referring to FIGS. 2 and 3A, the second control module E2 of the control modules 104 may be mounted on the other side S2 of the mounting plate 116 of the control module mounting unit 114 separately, or spaced apart, from the heat-dissipation unit 130.

Unlike the first control module E1, the second control module E2, in an embodiment, may be mounted directly on the mounting plate 116.

Since the second control module E2 may include an electronic element such as an inductor that occupies a larger volume than other parts, it may be mounted on the other side S2 of the control module mounting unit 114 for efficient space utilization in the energy storage system case 100. However, although not illustrated, in another embodiment, other control modules performing a correlation operation with the second control module may be disposed on the opposite side of the second control module, that is, on the one side S1 of the mounting plate 116, and the connection therebetween may be performed by a wire (not illustrated) passing through the mounting plate 116.

Also, since the second control module E2 is mounted on the other side S2 of the control module mounting unit 114, it may need to be protected from an external environment, such as impact or moisture permeation. Thus, according to an embodiment, the energy storage system case 100 includes the control module cover 150 that isolates the second control module E2 from the outside thereof.

In this case, for a sealing structure, the adhesion unit 140 may be applied between the control module cover 150 and the other side S2 of the mounting plate 116. Accordingly, the second control module E2 is also accommodated in a sealing structure protected from an external environment.

In an embodiment, the first control module E1 is mounted on the one side S1 of the mounting plate 116 of the control mod ale mounting unit 114 and has a sealing structure achieved by the casing cover 120 and the heat-dissipation unit 130, and the second control module E2 is mounted on the other side S2 of the mounting plate 116 of the control module mounting unit 114 and has a sealing structure achieved by the control module cover 150, such that the control modules 104 are protected from an external environment. In an embodiment, for a more complete sealing structure, the adhesion unit 140 may be involved as described above.

In an embodiment, referring to FIGS. 1 and 2, the energy storage system case 100 may further include the heat-dissipation cover 160 that is coupled to the body unit 110 to face the other side S2 of the mounting plate 116.

The heat-dissipation cover 160 may be coupled to the body unit 110 to cover the heat-dissipation unit 130 and the control module cover 150, and may be formed to form a substantially flat surface 112a with the battery accommodating unit 112 of the body unit 110.

Also, since the casing cover 120 coupled to the body unit 110 to cover the control module mounting unit 114 on the opposite side thereof is formed to form a substantially flat surface 112b with the battery accommodating unit 112 of the body unit 110, the energy storage system case 100, in an embodiment, may have a compact rectangular parallelepiped structure as a whole.

In an embodiment, in order for the heat-dissipation cover 160 to accommodate the heat-dissipation unit 130 therein to properly perform a heat-dissipation function, the heat-dissipation cover 160 may have a plurality of openings as illustrated in FIGS. 1 and 2.

In this manner, according to an embodiment, the energy storage system case 100 has a sealing structure for protecting a plurality of batteries accommodated therein from the external environment and a sealing structure for protecting the control modules controlling the charge/discharge of the plurality of batteries from the external environment.

Also, the inventive concept may increase the heat-dissipation effect by using the heat-dissipation unit directly contacting the control module having a large heat generation amount, may configure an energy storage system more compactly by securing the sealing structure for the control modules, and may improve the user accessibility to a home energy storage system that may be domestically used.

Accordingly, as described above, the inventive concept may provide a waterproof and vibration-proof structure for a plurality of secondary batteries therein and control modules controlling the plurality of secondary batteries.

Also, the inventive concept may secure the waterproof and vibration-proof structure without being greatly affected by the flatness of a part assembly surface and may effectively dissipate the heat generated by the control modules to the outside thereof.

Also, the inventive concept may improve the user accessibility by compactly constructing the energy storage system case having excellent waterproof, vibration-proof, and heat-dissipation effects.

Although the inventive concept has been described above by the drawings, certain embodiments, and particular features such as specific components, this is provided merely to assist a more overall understanding of the inventive concept, the inventive concept is not limited to the above embodiments, and various changes and modifications may be made therein. Thus, the spirit and scope of the inventive concept should not be limited by the above embodiments and may include not only the following claims but also equivalents thereof or equivalent modifications thereof.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the defined by the following claims.

What is claimed is:

1. An energy storage system case comprising:
a body unit comprising a battery accommodating unit configured to accommodate a plurality of batteries, and a control module mounting unit comprising a mounting plate on both sides of which control modules are configured to be mounted to control charge/discharge of the plurality of batteries, the mounting plate having an opening extending from a first side of the mounting plate to a second side of the mounting plate opposite the first side;
a casing cover coupled to the body unit to face the first side of the mounting plate; and
a heat-dissipation unit located opposite the casing cover and coupled to the mounting plate to dissipate heat generated by a first control module among the control modules to an outside thereof,
wherein the heat-dissipation unit is coupled to the second side of the mounting plate to completely block the opening such that a space between the mounting plate and the casing cover is sealed from an external environment.

2. The energy storage system case of claim 1, wherein the first side and the second side of the mounting plate are in communication with each other through the opening.

3. The energy storage system case of claim 2, wherein the first control module is configured to be mounted on the first side of the mounting plate to contact the heat-dissipation unit mounted on the second side of the mounting plate through the opening.

4. The energy storage system case of claim 3, wherein the first control module is configured to be arranged between the casing cover and the first side of the mounting plate and closed from an outside thereof by the casing cover and the heat-dissipation unit.

5. An energy storage system case comprising:
a body unit comprising a battery accommodating unit configured to accommodate a plurality of batteries, and a control module mounting unit on both sides of which control modules are configured to be mounted to control charge/discharge of the plurality of batteries;
a casing cover coupled to the body unit; and
a heat-dissipation unit located opposite the casing cover and coupled to the control module mounting unit to dissipate heat generated by a first control module among the control modules to an outside thereof,
wherein the control module mounting unit comprises a mounting plate having an opening formed therein, and a first side and a second side of the mounting plate are in communication with each other through the opening,
wherein a first control module is configured to be mounted on the first side of the mounting plate to contact the heat-dissipation unit mounted on the second side of the mounting plate through the opening,
wherein the heat-dissipation unit is coupled to the second side of the mounting plate to block the opening,
wherein the casing cover is coupled to the body unit to face the first side of the mounting plate, and
the first control module is configured to be arranged between the casing cover and the first side of the mounting plate and closed from an outside thereof by the casing cover and the heat-dissipation unit, and
wherein the heat-dissipation unit comprises a base unit and a heat-dissipation fin extending from the base unit, and
the base unit and the second side of the mounting plate are adhered to each other by an adhesion unit arranged therebetween.

6. The energy storage system case of claim 5, wherein the adhesion unit comprises a first adhesion layer, a second adhesion layer, and a foam layer located between the first adhesion layer and the second adhesion layer.

7. The energy storage system case of claim 5, wherein the adhesion unit is arranged around the opening.

8. The energy storage system case of claim 3, wherein
a second control module among the control modules is configured to be mounted on the second side of the mounting plate spaced apart from the heat-dissipation unit, and
the first control module has a larger heat generation amount than the second control module in an operation for controlling the charge/discharge of the plurality of batteries.

9. The energy storage system case of claim 8, further comprising a control module cover coupled to the second side of the mounting plate and configured to cover the second control module,
wherein the control module cover and the second side of the mounting plate are adhered to each other by an adhesion unit arranged therebetween.

10. The energy storage system case of claim 3, further comprising a heat-dissipation cover coupled to the body unit to face the second side of the mounting plate,
wherein each of the heat-dissipation cover and the casing cover forms a flat surface with the battery accommodating unit.

11. An energy storage system comprising the energy storage system case of claim 1, the energy storage system further comprising the plurality of batteries, the plurality of batteries being accommodated in the battery accommodating unit, and further comprising the control modules, the control modules being mounted on both sides of the control module mounting unit and configured to control charge/discharge of the plurality of batteries.

12. The energy storage system of claim 11, wherein the first side and the second side of the mounting plate are in communication with each other through the opening.

13. The energy storage system of claim 12, wherein
a first control module among the control modules is mounted on the first side of the mounting plate, and
the first control module contacts the heat-dissipation unit mounted on the second side of the mounting plate through the opening.

14. The energy storage system of claim 13, wherein
the first control module between the casing cover and the first side of the mounting plate is closed from an outside thereof by the casing cover and the heat-dissipation unit.

15. The energy storage system of claim 14, wherein
the heat-dissipation unit comprises a base unit and a heat-dissipation fin extending from the base unit, and
the base unit and the second side of the mounting plate are adhered to each other by an adhesion unit arranged therebetween.

16. An energy storage system comprising:

an energy storage system case comprising a body unit;

a plurality of batteries accommodated in a battery accommodating unit of the body unit; and control modules mounted on both sides of a control module mounting unit of the body unit and configured to control charge/discharge of the plurality of batteries, wherein the energy storage system case comprises:

the body unit comprising the battery accommodating unit configured to accommodate the plurality of batteries, and the control module mounting unit on both sides of which the control modules are configured to be mounted to control charge/discharge of the plurality of batteries;

a casing cover coupled to the body unit; and a heat-dissipation unit located opposite the casing cover and coupled to the control module mounting unit to dissipate heat generated by a first control module among the control modules to an outside thereof, wherein the control module mounting unit comprises a mounting plate having an opening formed therein, and a first side and a second side of the mounting plate are in communication with each other through the opening, wherein the first control module among the control modules is mounted on the first side of the mounting plate, and the first control module contacts the heat-dissipation unit mounted on the second side of the mounting plate through the opening, wherein the heat-dissipation unit is coupled to the second side of the mounting plate to block the opening, and wherein a second control module among the control modules is mounted on the second side of the mounting plate spaced apart from the heat-dissipation unit, and the first control module has a larger heat generation amount than the second control module in an operation for controlling the charge/discharge of the plurality of batteries.

17. The energy storage system of claim 16, further comprising a control module cover coupled to the second side of the mounting plate to cover the second control module, wherein the control module cover and the second side of the mounting plate are adhered to each other by an adhesion unit arranged therebetween.

18. The energy storage system of claim 13, wherein the energy storage case further comprises a heat-dissipation cover coupled to the body unit to face the second side of the mounting plate, wherein each of the heat-dissipation cover and the casing cover forms a flat surface with the battery accommodating unit.

* * * * *